United States Patent [19]
Duke et al.

[11] Patent Number: 5,098,533
[45] Date of Patent: Mar. 24, 1992

[54] ELECTROLYTIC METHOD FOR THE ETCH BACK OF ENCAPSULATED COPPER-INVAR-COPPER CORE STRUCTURES

[75] Inventors: Peter J. Duke, Endwell; Krystyna W. Semkow, Johnson City, both of N.Y.

[73] Assignee: International Business Machines Corp., Armonk, N.Y.

[21] Appl. No.: 651,073

[22] Filed: Feb. 6, 1991

[51] Int. Cl.[5] .............................................. C25F 3/02
[52] U.S. Cl. .......................... 204/129.35; 204/129.43; 204/129.7; 204/129.75; 427/97
[58] Field of Search .................... 204/129.35, 129.43, 204/129.7, 129.75, 129.95; 427/97

[56] References Cited

U.S. PATENT DOCUMENTS

| | | | |
|---|---|---|---|
| 3,129,153 | 4/1964 | Margulies et al. | 204/143 |
| 4,404,074 | 9/1983 | Tomaszewski | 204/146 |
| 4,475,995 | 10/1984 | Ziegler et al. | 204/129.2 |
| 4,481,089 | 11/1984 | Izumida et al. | 204/129.43 |
| 4,481,090 | 11/1984 | Childs | 204/129.75 |
| 4,486,279 | 12/1984 | Fromson et al. | 204/129.5 |

Primary Examiner—John Niebling
Assistant Examiner—William T. Leader
Attorney, Agent, or Firm—Richard M. Goldman

[57] ABSTRACT

Disclosed is a method of fabricating a microelectronic package having least one layer formed of a copper-Invar-copper core encapsulated between a pair of dielectric films. The method includes exposing a copper-Invar-copper surface of the copper-Invar-copper core, for example, exposing an edge of the copper-Invar-copper core or drilling a whole through the layer to expose internal copper-Invar-copper. The copper-Invar-copper is then shaped, that is, back etched. This is an electrolytic process where the package is immersed in a substantially pH neutral electrolyte including a counter-electrode. A preferred electrolyte is an aqueous alkali metal nitrate solution. The electrolyte wets the exposed surface of said copper-Invar-copper core. The exposed surface of the copper-Invar-copper core is rendered anodic with respect to the counter-electrode and an electrical potential is applied therebetween. This results in electrochemically etching and shaping the copper-Invar-copper surface.

10 Claims, 2 Drawing Sheets

ELECTROLYTIC METHOD FOR THE ETCH BACK OF ENCAPSULATED COPPER-INVAR-COPPER CORE STRUCTURES

FIELD OF THE INVENTION

The invention relates to the fabrication of metal core microelectronic circuit packages. More particularly the invention relates to microelectronic circuit packages having polymer encapsulated copper-Invar-copper cores. Mechanical drilling of the copper-Invar-copper core gives rise to imperfections in the exposed copper-Invar-copper surface, and further removal of the copper-Invar-copper is required in order to allow isolation of the core from electrically conductive vias and through holes. This requires post-drilling etch-back of the exposed copper-Invar-copper core.

"Invar" is a registered trademark of Imphy S.A., 168 Rue De Rivoli, Paris, France for an "alloy which is substantially inexpansible," Registration No. 0063970. Invar is an iron-nickel alloy containing approximately sixty four weight percent iron and thirty six weight percent nickel.

According to the disclosed method, copper-Invar-copper etch back is accomplished by rendering the exposed surface of the copper-Invar-copper core anodic with respect to a cathode in a relatively pH neutral aqueous solution of an inorganic salt of an alkali and an oxidizing acid.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y. (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation. One type of printed circuit board is a metal core printed circuit board.

Metal core printed circuit boards are described by Nandakumar G. Aakalu and Frank J. Bolda in "Coated-Metal Packaging", in Rao R. Tummala and Eugene J. Rymaszewski, *Microelectronic Packaging Handbook*, Van Nostrand Reinhold, New York, N.Y. (1988), at pages 923 to 953, specifically incorporated herein by reference.

As used herein, coated metal packages, also referred to as metal core packages, are polymer encapsulated conductive metal cores. Circuitization, that is, personalization, is carried out on the surface of the polymeric encapsulant, with vias and through holes passing through the polymeric encapsulant and the metal core.

The metal core may be a copper core, or a copper-Invar-copper core. Copper and copper-Invar-copper cores spread out the heat from the devices mounted on the card or board. The high thermal conductivity allows the devices, for example the memory devices or logic devices, to operate at lower temperatures. The metal core also provides high mechanical strength and rigidity to the package. The metal core allows the substrate to carry large and heavy components, and to function in environments where shock, vibration, heat, and survivability are a factor.

Copper-Invar-copper is a particularly desirable core material because of its thermal, electrical, and mechanical properties. Invar is an iron-nickel alloy containing approximately sixty four weight percent iron and thirty six weight percent nickel. While deviations from this composition are possible, the 64-36 alloy has the lowest coefficient of thermal expansion in the iron-nickel binary system, approximately $1.5 \times 10^{-7}$/degree Centigrade.

Lamination of the Invar between copper films of controlled thickness determines the properties of the copper-Invar-copper core. This is shown in Table 1, below, adapted from Nandakumar G. Aakalu and Frank J. Bolda in "Coated-Metal Packaging", in Rao R. Tummala and Eugene J. Rymaszewski, *Microelectronic Packaging Handbook*, Van Nostrand Reinhold, New York, N.Y. (1988), Table 13-2, at page 932.

TABLE 1

| Properties of Copper-Invar-Copper | | |
|---|---|---|
| Property | Cu/In/Cu | Cu/In/Cu |
| % Cu/% Invar/% Cu | 12.5/75/12.5 | 20/60/20 |
| Coefficient of thermal expansion ($\times 10^{-7}$/deg C.) | 44 | 53 |
| Electrical Resistivity (micro-ohm-cm) | 7.0 | 4.3 |
| Young's Modulus ($10^5$ mPa) | 1.4 | 1.35 |
| Enlongation (%) | 2.0 | 2.5 |
| Tensile Strength (mPa) | 380–480 | 310–410 |
| Density (grams/cm$^3$) | 8.33 | 8.43 |
| Thermal Conductivity | | |
| x-y plane | 107 | 160 |

TABLE 1-continued

| | Properties of Copper-Invar-Copper | |
|---|---|---|
| Property | Cu/In/Cu | Cu/In/Cu |
| z plane | 14 | 18 |
| Thermal Diffusivity (cm$^2$/second) | 0.249 | 0.432 |
| Specific Heat (Watts/gm deg C.) | 0.484 | 0.459 |
| Yield Strength | 240-340 | 170-270 |

The encapsulating polymer may be a perfluorocarbon, a phenolic, an epoxy, or a polyimide. For example, the encapsulant may be a phenolic-fiber composite, exemplified by phenolic and paper. Alternatively, the encapsulant may be an epoxy-fiber composite, illustrated by, for example, epoxy and glass fiber, and epoxy and polyperfluorocarbon fiber. According to a still further alternative, the encapsulant may be a polyimide-fiber composite, such as polyimide and glass fiber, polytetrafluoroethylene and glass fiber, or polyimide and polyperfluorocarbon fiber.

In low circuit density applications, where the vias and through holes are on a wide pitch, i.e., about ten or less per square centimeter, and are large diameter, i.e., greater than about 0.8 millimeters in diameter, simple techniques can be used to avoid shorting the vias and through holes. Thus, where the metal core package contains such vias and through holes, the polymer may be applied after the vias and through holes are drilled. This allows the deposited polymer to provide the through hole insulation.

Alternatively, the core or compensator may be encapsulated, drilled, the Cu etched back, and the vias and through holes coated with dielectric.

This is not the case with high circuit density metal core packages. One problem of high circuit density metal core packages is poor dielectric coverage of the vias and through holes. This poor coverage results in shorting of the vias and through holes by and/or through the metal core structure. This propensity to shorting results in the practical limitation of metal core packages to single sided boards, and to via-less double sided boards with edge connections.

OBJECTS OF THE INVENTION

It is one object of the invention to provide high density metal core cards and boards.

It is another object of the invention to provide via and through hole coverage in high circuit density metal core packages.

It is a further object of the invention to provide two sided metal core circuit packages having plated through holes and vias connecting the circuitization on both sides of the package without shorting the core.

It is a further object of the invention to provide metal core circuit packages having ten or more vias and/or through holes per square centimeter without shorting the core.

It is a further object of the invention to provide metal core circuit packages having plated through hole diameters and via diameters of less than 0.8 millimeters without shorting the core.

It is a further object of the invention to provide metal core circuit packages having narrow diameter plated through holes and vias and, being capable of accomodating high wiring density surface circuitization, e.g. corresponding to surface circuitization line widths of 0.25 millimeters and less, with concomitant surface circuitization density, without shorting the core.

SUMMARY OF THE INVENTION

These and other objects are obtained by the microelectronic circuit package fabrication method of the invention. The fabrication method is useful for fabricating a metal core microelectronic package having at least one layer formed of a copper-Invar-copper core encapsulated between a pair of dielectric films.

The fabrication method includes shaping or back-etching an exposed copper-Invar-copper plane, i.e., a compensator plane, power plane, or ground plane, for example, for subsequent application of an insulating dielectric layer. The method starts with an exposed copper-Invar-copper surface. This surface may be an external surface at the edge of a card or board, or, as is more likely to be the case, it may be an internal copper-Invar-copper surface exposed in a hole drilling surface.

According to the method disclosed herein the exposed copper-Invar-copper is shaped, that is, back etched. This is an electrolytic process where the package is immersed in a substantially pH neutral electrolyte including a counter-electrode. The electrolyte wets the exposed surface of said copper-Invar-copper core. The exposed surface of the copper-Invar-copper core is rendered anodic with respect to the counter-electrode and an electrical potential is applied therebetween. This results in electrochemically etching and shaping the copper-Invar-copper surface.

Thus, according to the invention there is provided a method of fabricating high density metal core cards and boards. The metal core circuit packages are characterized by via and through hole coverages that allow high surface circuitization densities, i.e., ten or more vias and/or through holes per square centimeter, plated through hole and via diameters of less then 0.8 millimeters, and especially plated through hole and via diameters capable of accomodating high wiring density surface circuitization, e.g. corresponding to surface circuitization line widths of 0.25 millimeters and less, with concomitant surface circuitization density. The metal core packages are by two sided metal core circuit packages having plated through holes and vias connecting the circuitization on both sides of the package without shorting the core.

THE FIGURES

The invention must be understood by reference to the Figures.

DETAILED DESCRIPTION OF THE INVENTION

Figure 1:
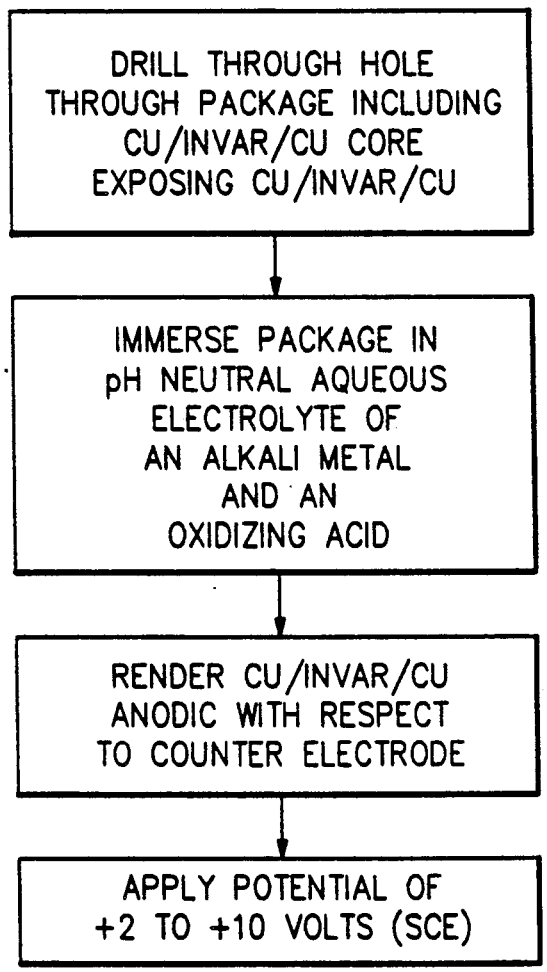
FIG. 1 is a flow chart of the method of the invention.

The method of the invention is illustrated in the flow chart of FIG. 1. FIG. 1 illustrates a microelectronic circuit package fabrication method useful for fabricating a metal core microelectronic package having at least one layer formed of a copper-Invar-copper core encapsulated between a pair of polymeric dielectric films.

The fabrication method includes shaping or back-etching an exposed copper-Invar-copper plane, i.e., a compensator plane, power plane, or ground plane, for example, for subsequent application of an insulating dielectric layer. The method starts with an exposed copper-Invar-copper surface. This surface may be an external surface at the edge of a card or board, or it may be an internal copper-Invar-copper surface exposed in a hole drilling surface. Generally, when the exposed surface is an internal surface, it is a drilled surface, characterized by burrs and other irregularities.

According to the method disclosed herein the exposed copper-Invar-copper is then shaped, that is, back etched. This is an electrolytic process where the package is immersed in a substantially pH neutral electrolyte including a counter- electrode. The electrolyte wets the exposed surface of said copper-Invar-copper core.

In the next step the exposed surface of the copper-Invar-copper core is rendered anodic with respect to the counter-electrode and an electrical potential is applied therebetween. This results in electrochemically etching and shaping the copper-Invar-copper surface.

The electrolyte is a substantially pH neutral (i.e., a solution having a pH of about 4.5 to 9.5) aqueous solution of a salt of a strong acid and a strong base, i.e., a completely ionized acid and a completely ionized base. The preferred strong base is an alkali metal, and the preferred acid is an oxidizing acid. The salt is chosen from the group consisting of sodium and potassium salts of P, N, and S containing acids. Exemplary are the phosphorus oxy acids, $H_3PO_4$, $H_3PO_3$, and $H_3PO_2$, the nitrogen oxy acids, as $NO^-2$, and $NO^-3$, and, and the sulfur oxy acids, such as $SO^=3$, and $SO^=4$. Especially preferred is $NO^-3$. Especially preferred salts thereof are the potassium salt, potassium nitrate, $KNO_3$, and the sodium salt, $NaNO_3$.

The electrolyte is at least about 2 Molar, for example 2 Molar sodium nitrate, and up to saturated. The preferred range is above about 5 Molar, for example above about 5 Molar sodium nitrate.

The metal core is maintained anodic with respect to the counter electrode. That is, the potential of the copper-Invar-copper metal core is maintained at a potential of about +2 Volts to +10 Volts versus a Saturated Calomel Electrode, and preferably at a potential of about +4 Volts to +5 Volts versus a Saturated Calomel Electrode.

The potential on the exposed copper-Invar-copper may be continuous d.c., or it may be pulsed d.c.

According to a particularly preferred exemplification of the invention increased electrolyte contact and diffusivity may be provided by ultrasonically agitating the electrolyte.

Figure 2:
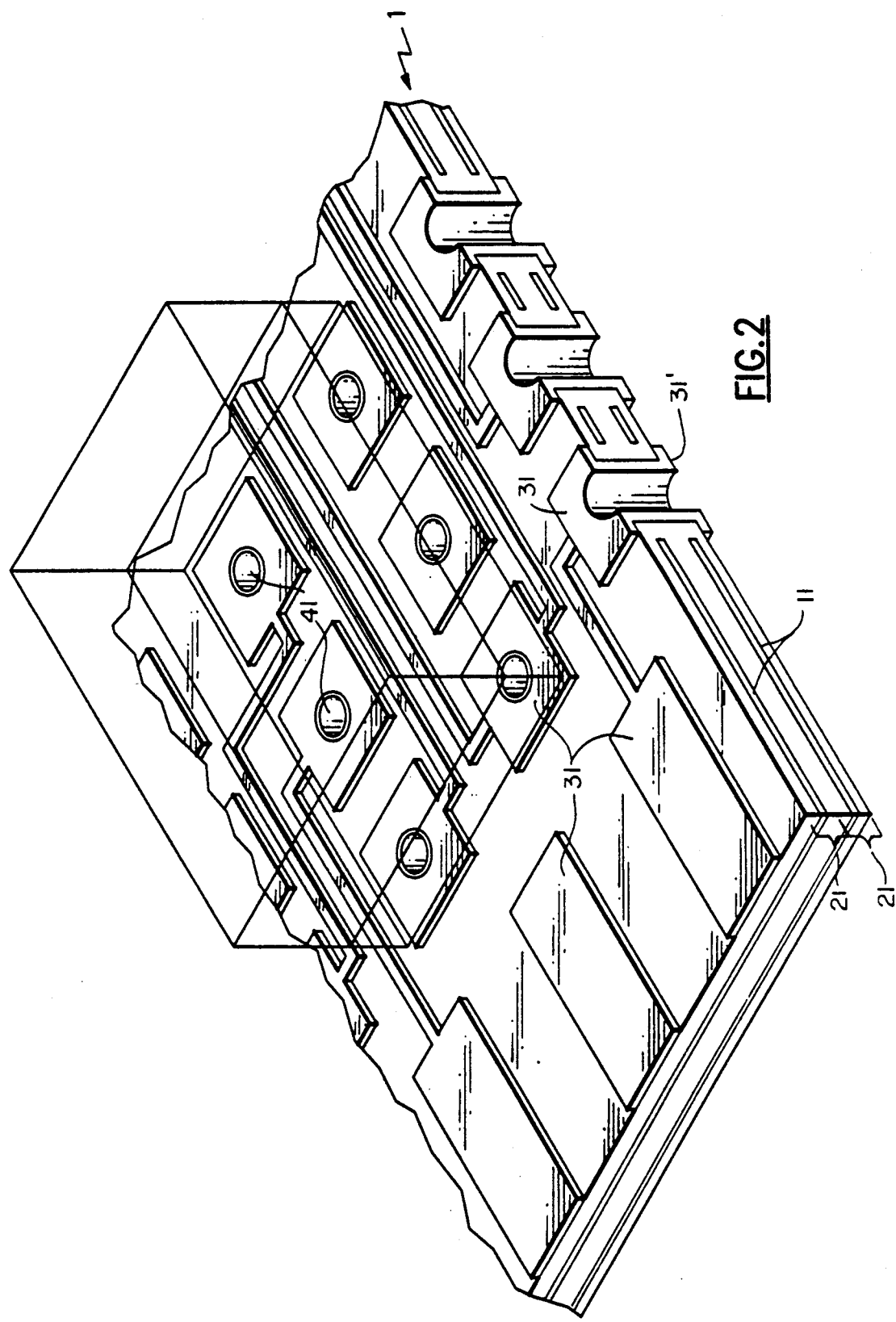
FIG. 2 is a perspective, partial cutaway view of a metal core package produced according to the method of the invention.

A high density metal core package prepared by a method of the invention is shown in FIG. 2. The metal core circuit package 1 has a metal core 11 encapsulated by a pair of polymeric layers 21. The polymeric layers carry surface circuitization 31 including through holes 41. The through holes are characterized by dielectric coverage that allows high surface circuitization densities, i.e., ten or more vias and/or through holes per square centimeter, plated through hole diameters and via diameters of less then 0.8 millimeters, and especially plated through hole diameters and via diameters and capable of accomodating high wiring density surface circuitization, e.g. corresponding to surface circuitization line widths of 0.25 millimeters and less, with concomitant surface circuitization density.

To be noted is that the metal core package 1 shown in the FIGURE is a two sided metal core circuit package having plated through holes connecting the surface circuitization, 31, 31', on both sides of the package, 1, without shorting the metal core, 11.

While the invention has been described with respect to certain preferred embodiments and exemplifications, it is not intended to limit the scope of the invention thereby, but solely by the claims appended hereto.

We claim:

1. A method of fabricating a multi-layer electronic circuit package, said package comprising at least one layer having a copper-Fe/Ni alloy-copper laminate core between dielectric films, and a plated through hole extending through said layer and electrically insulated from said copper-Fe/Ni alloy-copper laminate core, which method comprises:
   a. drilling a hole through said layer including said copper-Fe/Ni alloy-copper laminate core;
   b. immersing said layer in a substantially pH neutral aqueous alkali metal nitrate electrolyte solution, said electrolyte including a counter electrode, and wetting the copper-Fe/Ni alloy-copper laminate core with said electrolyte;
   c. applying an electrical potential between the copper-Fe/Ni alloy-copper laminate core and the counter electrode to make the core anodic with respect to the counter electrode, maintaining said laminate core anodic at a potential of +2 Volts to +10 Volts versus a saturated calomel electrode while ultrasonically agitating the electrolyte to electrochemically back etch the laminate core within the hole;
   d. thereafter applying an insulating dielectric polymer to the walls of the back-etched hole; and
   e. thereafter plating the insulating dielectric polymer bearing walls of the back etched through hole to form a plated through hole through the layer and insulated from the laminate core.

2. The method of claim 1 wherein the aqueous alkali metal nitrate is sodium nitrate.

3. The method of claim 2 wherein the aqueous alkali metal nitrate is at least about 2 molar sodium nitrate.

4. The method of claim 3 wherein the aqueous alkali metal nitrate is about 5 molar sodium nitrate.

5. The method of claim 1 comprising maintaining the copper-Fe/Ni alloy-copper at a potential of about +4 to +5 volts versus a Saturated Calomel Electrode.

6. The method of claim 1 wherein the potential is continuous direct current.

7. The method of claim 1 wherein the potential is pulsed direct current.

8. The method of claim 1 wherein the Fe/Ni alloy has a coefficient of thermal expansion of about $1.5 \times 10^{-7}$/degree Centigrade.

9. The method of claim 8 wherein the Fe/Ni alloy is a 64 weight percent Fe- 36 weight percent Ni alloy.

10. A method of fabricating a multi-layer electronic circuit package, said package comprising:
   i. at least one layer having a copper-Fe/Ni alloy-copper laminate core between a pair of dielectric films, said Fe/Ni alloy having a coefficient of thermal expansion of about $1.5 \times 10^{-7}$/degree Centigrade and comprising about 64 weight percent Fe and about 36 weight percent Ni; and
   ii. a plated through hole extending through said layer and electrically insulated from said copper-Fe/Ni alloy-copper laminate core;
   which method comprises:
   a. drilling a through hole through said layer including said copper-Fe/Ni alloy-copper laminate core;
   b. immersing said layer in a substantially pH neutral aqueous sodium nitrate electrolyte solution having a concentration of at least 2 molar sodium nitrate, said electrolyte including a counter electrode, and wetting the copper-Fe/Ni alloy-copper laminate core with said electrolyte;

c. applying an electrical potential between the copper-Fe/Ni alloy-copper laminate core and the counter electrode to make the core anodic with respect to the counter electrode, maintaining said laminate core anodic at a potential of +4 Volts to +5 Volts versus a saturated calomel electrode while ultrasonically agitating the electrolyte to electrochemically back etch the laminate core within the hole;

d. thereafter applying an insulating dielectric polymer to the walls of the back-etched through hole; and e. thereafter plating the insulating dielectric polymer bearing walls of the back etched hole to form a plated through hole through the layer and insulated from the laminate core.

* * * * *